US007291440B2

(12) United States Patent
Ray et al.

(10) Patent No.: US 7,291,440 B2
(45) Date of Patent: Nov. 6, 2007

(54) BAKEABLE MULTI-LAYER IMAGEABLE ELEMENT

(75) Inventors: Kevin B. Ray, Fort Collins, CO (US); Anthony P. Kitson, Evans, CO (US)

(73) Assignee: Eastman Kodak Company, Rochester, NY (US)

( * ) Notice: Subject to any disclaimer, the term of this patent is extended or adjusted under 35 U.S.C. 154(b) by 118 days.

(21) Appl. No.: 11/129,844

(22) Filed: May 16, 2005

(65) Prior Publication Data

US 2006/0257764 A1 Nov. 16, 2006

(51) Int. Cl.
*G03F 7/00* (2006.01)
*G03F 7/004* (2006.01)

(52) U.S. Cl. .............................. 430/270.1; 430/281.1; 430/283.1; 430/273.1; 430/944; 430/945

(58) Field of Classification Search .................... None
See application file for complete search history.

(56) References Cited

U.S. PATENT DOCUMENTS

| | | | |
|---|---|---|---|
| 5,731,127 | A | 3/1998 | Ishizuka et al. |
| 6,060,217 | A | 5/2000 | Nguyen et al. |
| 6,143,464 | A | 11/2000 | Kawauchi |
| 6,340,551 | B1 | 1/2002 | Miyake et al. |
| 6,352,811 | B1 | 3/2002 | Patel et al. |
| 6,475,692 | B1 | 11/2002 | Jarek et al. |
| 6,506,536 | B2 | 1/2003 | Pappas et al. |
| 6,525,152 | B1 | 2/2003 | Jarek |
| 6,645,689 | B2 | 11/2003 | Jarek |
| 2002/0160299 | A1 | 10/2002 | Asawa et al. |
| 2003/0203312 | A1 | 10/2003 | Serikawa et al. |
| 2005/0037292 | A1 | 2/2005 | Kitson et al. |

FOREIGN PATENT DOCUMENTS

| | | | |
|---|---|---|---|
| EP | 1 522 417 | A1 | 4/2005 |
| JP | H11-119419 | | 4/1999 |
| JP | 2000-330265 | | 11/2000 |
| WO | WO 01/46318 | A1 | 6/2001 |
| WO | WO 02/053627 | A1 | 7/2002 |
| WO | WO 2005/018934 | A1 | 3/2005 |

*Primary Examiner*—Amanda Walke
(74) *Attorney, Agent, or Firm*—J. Lanny Tucker

(57) ABSTRACT

Thermally imageable multilayer imageable elements useful as lithographic printing plate precursors that have good solvent resistance are disclosed. The underlayer of the imageable element comprises an acidic copolymer that comprises, in polymerized form, about 10 mol % to about 75 mol % of one or more monomers of the formula:

$CH_2{=}CH(R^1)\text{-Z-X—NH—CO—NH—}C_6H_3\text{—}(R^2)(CO_2H)$;

in which: $R^1$ is H or $CH_3$; $R^2$ is H or OH; Z is —$C_6H_4$— or —C(O) —Y—; Y is —O— or —NH—; and X is selected from —$C(CH_3)_2$—, —$CH(CH_3)$— and —$(CH_2)_n$—, in which n is an integer from 1 to 12.

27 Claims, No Drawings

BAKEABLE MULTI-LAYER IMAGEABLE ELEMENT

FIELD OF THE INVENTION

The invention relates to lithographic printing. In particular, this invention relates to imageable elements useful as lithographic printing plate precursors that have good solvent resistance.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically comprise an imageable layer applied over the hydrophilic surface of a substrate. The imageable layer includes one or more radiation-sensitive components, which may be dispersed in a suitable binder. Alternatively, the radiation-sensitive component can also be the binder material. Following imaging, either the imaged regions or the unimaged regions of the imageable layer are removed by a suitable developer, revealing the underlying hydrophilic surface of the substrate. If the imaged regions are removed, the precursor is positive-working. Conversely, if the unimaged regions are removed, the precursor is negative-working. In each instance, the regions of the imageable layer (i.e., the image areas) that remain are ink-receptive, and the regions of the hydrophilic surface revealed by the developing process accept water and aqueous solutions, typically a fountain solution, and repel ink.

Direct digital imaging, which obviates the need for imaging through a mask, is becoming increasingly important in the printing industry. There is a desire for positive working, thermally imageable elements that can be developed in conventional alkaline developers and that are both bakeable and resistant to press chemistries, such as inks, fountain solution, and the solvents used in washes, such as UV washes. Bakeability is highly desirable because baking increases the press runlength. Thus, a need exists for thermally imageable elements that can be developed in alkaline developers, resist chemicals typically encountered in a press room environment, and can be baked in order to increase runlength.

SUMMARY OF THE INVENTION

In one aspect, the invention is an imageable element that has excellent chemical resistance. The imageable element comprises a substrate; an underlayer over the substrate; and a imageable layer over the underlayer;

in which:

the element comprises a photothermal conversion material;

the imageable layer is substantially free of the photothermal conversion material;

the imageable layer is ink receptive;

before thermal imaging, the imageable layer is not removable by an alkaline developer;

after thermal imaging to form imaged regions in the imageable layer, the imaged regions are removable by the alkaline developer;

the underlayer is removable by the alkaline developer, and the underlayer comprises an acidic copolymer that comprises, in polymerized form, about 10 mol % to about 75 mol % of an acidic monomer or mixture of acidic monomers of the formula:

$$CH_2{=}CH(R^1)\text{-}Z\text{-}X{-}NH{-}CO{-}NH{-}C_6H_3{-}(R^2)(CO_2H);$$

in which:

$R^1$ is H or $CH_3$;

$R^2$ is H or OH;

Z is $-C_6H_4-$ or $-C(O)-Y-$;

Y is $-O-$ or $-NH-$; and

X is selected from $-C(CH_3)_2-$, $-CH(CH_3)-$ and $-(CH_2)_n-$, in which n is an integer from 1 to 12.

In another aspect, the invention is a method for forming an image by imaging the imageable element, developing the imaged imageable element, and, optionally, baking the imaged and developed imageable element. In yet another aspect, the invention is the image, useful as a lithographic printing plate, formed by the method.

DETAILED DESCRIPTION OF THE INVENTION

Unless the context indicates otherwise, in the specification and claims, the terms binder, novolac resin, dissolution inhibitor, methyl methacrylate/methacrylic acid copolymer, acidic copolymer, additional monomer, photothermal conversion material, surfactant, and similar terms also include mixtures of such materials. Unless otherwise specified, all percentages are percentages by weight and all temperatures are in degrees Centigrade (degrees Celsius). Thermal imaging refers to imaging with a hot body, such as a thermal head, or with infrared radiation.

Acidic Copolymers

The acidic copolymers comprise, in polymerized form, from about 10 mol % to about 75 mol %, preferably from about 10 mol % to about 45 mol % of one or more acidic monomers of the formula:

$$CH_2{=}CH(R^1)\text{-}Z\text{-}X{-}NH{-}CO{-}NH{-}C_6H_3{-}(R^2)(CO_2H).$$

$R^1$ is hydrogen or methyl.

Z is $-C_6H_4-$ or $-C(O)-Y-$, in which Y is $-O-$ or $-NH-$. Z may be o-$C_6H_4-$, m-$C_6H_4-$, p-$C_6H_4-$, $-CO_2-$ or $-C(O)NH-$. Preferred groups for Z include m-$C_6H_4-$ and $-CO_2-$.

X is a bivalent linking group selected from $-C(CH_3)_2-$, $-CH(CH_3)-$ and $-(CH_2)_n-$, in which n is an integer from 1 to 12, typically 2 to 4. Preferred groups for X include $-C(CH_3)_2-$ and $-(CH_2)_n-$ in which n is 2.

$R^2$ is hydrogen or hydroxyl. The $-C_6H_3-(R^2)(CO_2H)$ group may be, for example: o-carboxy-phenyl(o-$C_6H_4-CO_2H$); m-carboxy-phenyl(m-$C_6H_4-CO_2H$); p-carboxy-phenyl(p-$C_6H_4-CO_2H$); 3-hydroxy-4-carboxy-phenyl; 2-hydroxy-4-carboxy-phenyl; 4-hydroxy-3-carboxy-phenyl; 4-hydroxy-3-carboxy-phenyl; 2-hydroxy-5-carboxy-phenyl; 2-hydroxy-6-carboxy-phenyl; 2-hydroxy-3-carboxy-phenyl;

3-hydroxy-2-carboxy-phenyl; 3-hydroxy-5-carboxy-phenyl; or 3-hydroxy-6-carboxy-phenyl. A preferred $R^2$ group is p-carboxy-phenyl.

These monomers can be represented by the following structures.

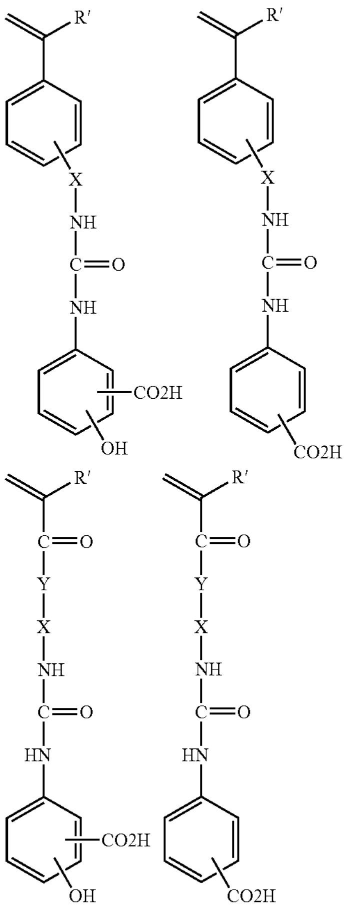

These monomers may be prepared by methods well known to those skilled in the art. For example, the monomers may be prepared by reaction of an appropriate isocyanate and an appropriate aminobenzoic acid. Useful isocyanates include those of the formula: $CH_2{=}CH(R^1)\text{-}Z\text{-}X{—}NCO$. Specific useful isocyanates will be apparent to those skilled in the art and include, for example, 3-ethenyl-alpha, alpha-dimethylbenzyl isocyanate; 4-ethenyl-alpha, alpha-dimethylbenzyl isocyanate; 3-ethenyl-alpha-methylbenzyl isocyanate; 4-ethenyl-alpha-methylbenzyl isocyanate; 3-iso-propenyl-alpha, alpha-dimethylbenzyl isocyanate (m-TMI); 3-iso-propenyl-alpha-methylbenzyl isocyanate; 4-iso-propenyl-alpha, alpha-dimethylbenzyl isocyanate; 4-iso-propenyl-alpha-methylbenzyl isocyanate; 2-iso-propenyl-alpha, alpha-dimethylbenzyl isocyanate; 2-(acryloxy)ethyl isocyanate; 3-(acryloxy)propyl isocyanate; 4-(acryloxy)butyl isocyanate; 2-(methacryloxy)ethyl isocyanate (MOI); 3-(methacryloxy)propyl isocyanate; 4-(methacryloxy)butyl isocyanate; 5-(methacryloxy)pentyl isocyanate; and 6-(methacryloxy)hexyl isocyanate. Specific useful aminobenzoic acids will be apparent to those skilled in the art and include, for example, p-aminobenzoic acid; m-aminobenzoic acid; o-aminobenzoic acid; 2-hydroxy-4-aminobenzoic acid; 3-hydroxy-4-aminobenzoic acid; 3-hydroxy-2-aminobenzoic acid; 4-hydroxy-2-aminobenzoic acid; 2-hydroxy-3-aminobenzoic acid; 4-hydroxy-3-aminobenzoic acid; and 2-hydroxy-5-aminobenzoic acid.

Especially useful monomers for the preparation of the acidic copolymers are represented by the following structures:

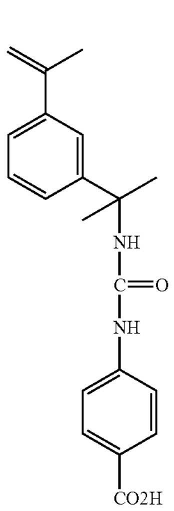

Monomer 1

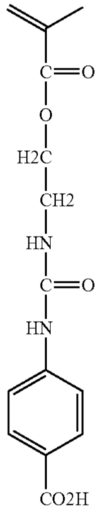

Monomer 2

Monomer 1, for example, may be prepared by the reaction of p-aminobenzoic acid with 3-iso-propenyl-alpha, alpha-dimethylbenzyl isocyanate (m-TMI). Monomer 2 may be prepared by reaction of p-aminobenzoic acid with 2-(methacryloxy)ethyl isocyanate (MOI).

An additional monomer or monomers is present in the acidic copolymer. Additional monomers that may be present include, for example, acrylonitrile; methacrylonitrile; acrylate and methacrylate monomers such as acrylic acid, methacrylic acid, methyl acrylate, ethyl acrylate, butyl acrylate, methyl methacrylate, methoxymethyl methacrylate, ethyl methacrylate, and butyl methacrylate; styrene and substituted styrenes, such as 3-vinyl benzoic acid and 4-vinyl benzoic acid; imides, such as N-phenylmaleimide, N-cyclohexylmaleimide, and N-benzylmaleimide; amides such as acrylamide, methacrylamide, N-methoxymethylacrylamide, N-methoxymethylmethacrylamide; and mixtures thereof. As will be apparent to those skilled in the art, the nature and amount of the additional monomers will be selected to control the properties of the acidic copolymer.

The acidic copolymers may comprise, in polymerized form, about 1 mol % to about 55 mol %, preferably about 5 mol % to about 40 mol %, of N-phenylmaleimide, N-cyclohexylmaleimide, N-benzylmaleimide, or a mixture thereof. N-Phenylmaleimide is preferred. The acidic copolymers may comprise, in polymerized form, about 1 mol % to about 40 mol %, preferably about 5 mol % to about 30 mol %, of acrylamide, methacrylamide, N-methoxymethylacrylamide, N-methoxymethylmethacrylamide, methoxymethyl methacrylate, or a mixture thereof. Methacrylamide is preferred. The acidic copolymers may comprise, in polymerized form, about 20 mol % to about 80 mol %, preferably about 35 mol % to about 65 mol %, of acrylonitrile, methacrylonitrile, or a mixture thereof. Acrylonitrile is preferred. The acidic copolymers may comprise, in polymerized form, about 5 mol % to about 40 mol %, preferably about 10 mol % to about 35 mol %, of acrylic acid, methacrylic acid, 4-vinyl benzoic acid, or a mixture thereof. Methacrylic acid is preferred.

The acidic copolymers may be prepared by various routes. The acidic copolymers may be prepared by, for example, free radical polymerization. For example, the monomers indicated above may be polymerized in the desired amounts to produce the desired copolymer.

Free radical polymerization is well known to those skilled in the art and is described, for example, in Chapters 20 and 21, of *Macromolecules*, Vol. 2, 2nd Ed., H. G. Elias, Plenum, N.Y., 1984. Useful free radical initiators are peroxides such as benzoyl peroxide, hydroperoxides such as cumyl hydroperoxide and azo compounds such as 2,2'-azobis(isobutyronitrile) (AIBN). Chain transfer agents, such as dodecyl mercaptan, may be used to control the molecular weight of the compound. Suitable solvents for free radical polymerization include liquids that are inert to the reactants and which will not otherwise adversely affect the reaction, for example, water; esters such as ethyl acetate and butyl acetate; ketones such as methyl ethyl ketone, methyl isobutyl ketone, methyl propyl ketone, and acetone; alcohols such as methanol, ethanol, isopropyl alcohol, and butanol; ethers such as dioxane, dioxolane, and tetrahydrofuran, and mixtures thereof.

Monomers may be polymerized in the desired amounts to produce the desired copolymer. For example, a mixture of the desired amount of each monomer may be copolymerized to produce the desired acidic copolymer.

Although the acidic copolymers have been defined in terms of the monomers that conceptually can be used to form the copolymers, this does not limit the copolymers to those formed by polymerization of the indicated monomers. The acidic copolymers may be formed by other routes that will be apparent to those skilled in the art, such as by modification of precursor polymers.

For example, an acidic copolymer may be produced by (1) formation of an appropriate precursor polymer that contains isocyanate groups, followed by (2) reaction of the isocyanate groups with the desire aminobenzoic acid.

Multilayer Imageable Elements

The acidic copolymers may be used in positive working, multilayer imageable elements. Multilayer imageable elements comprise an imageable layer, or top layer, which comprises an imageable composition over an underlayer, which is over the surface of a substrate. Other layers, such as an absorber layer and/or a barrier layer, that are conventional components of multilayer imageable elements may also be present. The imageable element also comprises a photothermal conversion material, which may be present in an underlayer and/or in a separate absorber layer between the imageable layer and the underlayer.

Imageable Layer

Any imageable layer conventionally used in multilayer, positive working, alkaline developable, thermally imageable elements may be used in the multilayer imageable elements. These elements are disclosed, for example, in Shimazu, U.S. Pat. No. 6,294,311, U.S. Pat. No. 6,352,812, and U.S. Pat. No. 6,593,055; Patel, U.S. Pat. No. 6,352,811; Hauck, U.S. Pat. No. 6,358,669; Savariar-Hauck, U.S. Pat. No. 6,528,228; Kitson, U.S. Pat. No. 6,858,359, and U.S. patent application Ser. No. 11/005,548, filed Dec. 6, 2004, the disclosures of which are all incorporated herein by reference.

The imageable layer is over the underlayer. The imageable layer becomes soluble or dispersible in the developer following thermal imaging. It comprises an imageable composition that comprises an ink-receptive polymeric material, known as the binder. Other materials that are conventional components of the imageable layer of multilayer imageable elements may also be present. The imageable layer typically has a dry coating weight of about 0.5 $g/m^2$ to about 1.0 $g/m^2$.

As disclosed in U.S. patent application Ser. No. 11/005,548, filed Dec. 6, 2004, the disclosure of which is incorporated herein by reference, the binder may comprise a co-polymer of maleic anhydride with styrene and/or one of more substituted styrenes and/or a co-polymer of methyl methacrylate with one or more carboxylic acid containing monomers. When a methyl methacrylate/methacrylic acid copolymer is used, the copolymer the molar ratio of methyl methacrylate to methacrylic acid is typically about 80:20 to about 98:2, preferably about 90:10 to about 95:5, and the copolymer consists essentially of methyl methacrylate and methacrylic acid. Preferably, the molecular weight of the copolymer is less than 200,000, more preferably less than 50,000, and even more preferably less than 10,000. When these binders are used, the imageable composition may also comprise one or more additional binders, such as a phenolic resin, such as a novolac resin, a resole resin, and/or a polyvinyl phenol. When present, the additional binder comprises about 0.1 wt % to about 50 wt %, preferably about 1 wt % to about 20 wt % of the imageable layer. When present, the preferred additional binders are novolac resins, such as are described below.

Alternatively, the binder may comprise an ink-receptive phenolic resin, such as a resole resin, a poly(vinyl phenol), a novolac resin, or a mixture thereof, and a dissolution inhibitor. Alternatively, or additionally, the phenolic resin may comprise polar groups and acts both as a binder and dissolution inhibitor.

Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or a ketone, such as acetone, in the presence of an acid catalyst. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-cresol, mixtures of m-cresol and p-cresol, or phenol with formaldehyde using conventional conditions.

In some cases, it may be desirable to include a novolac resin with the highest weight average molecular weight that maintains its solubility in common coating solvents, such as acetone, tetrahydrofuran, and 1-methoxypropan-2-ol. Imageable layers comprising novolac resins, including for example m-cresol only novolac resins (i.e. those that contain at least about 97 mol % m-cresol) and m-cresol/p-cresol novolac resins that have up to 10 mol % of p-cresol, having a weight average molecular weight of about 10,000 to at least about 25,000, may be used. Imageable layers comprising m-cresol/p-cresol novolac resins with at least 10 mol % p-cresol, having a weight average molecular weight of about 8,000 to about 25,000, may also be used. In some instances, novolac resins prepared by solvent condensation may be desirable. Imageable layers comprising these resins are disclosed in Kitson, U.S. Pat. No. 6,858,359, the disclosure of which is incorporated herein by reference.

When the binder is a phenolic resin such as a novolac resin, the imageable layer comprises a dissolution inhibitor, which functions as a solubility-suppressing component for the binder. Dissolution inhibitors have polar functional groups, preferably selected from electronegative first row elements, especially carbon, nitrogen, and oxygen. Dissolution inhibitors that are soluble in the developer are preferred. The dissolution inhibitor typically comprises at least about 0.1 wt % of the imageable layer, typically about 0.2 wt % to about 30 wt % of the imageable layer, preferably about 0.4 wt % to 15 wt % of the imageable layer, based on the dry weight of the layer.

Useful polar groups for dissolution inhibitors include, for example, diazo groups; diazonium groups; keto groups; sulfonic acid ester groups; phosphate ester groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds that contain a positively charged (i.e., quaternized) nitrogen atom useful as dissolution inhibitors include, for example, tetraalkyl ammonium compounds, and quaternized heterocyclic compounds such as quinolinium compounds, benzothiazolium compounds, pyridinium compounds, and imidazolium compounds. Compounds containing other polar groups, such as ether, amine, azo, nitro, ferrocenium, sulfoxide, sulfone, and disulfone may also be useful as dissolution inhibitors. The dissolution inhibitor may be a monomeric and/or polymeric compound that comprises an o-diazonaphthoquinone moiety.

A preferred group of dissolution inhibitors are triarylmethane dyes, such as ethyl violet, crystal violet, malachite green, brilliant green, Victoria blue B, Victoria blue R, Victoria blue BO, BASONYL® Violet 610, and D11. These compounds can also act as contrast dyes, which distinguish the unimaged regions from the imaged regions in the developed imageable element.

Alternatively, or additionally, the polymeric material in the imageable layer can comprise polar groups, and, thus, act as both a binder and dissolution inhibitor. The level of derivatization should be high enough that the polymeric material acts as a dissolution inhibitor, but not so high that, following thermal imaging, the polymeric material is not removable by the developer. Although the degree of derivatization required will depend on the nature of the polymeric material and the nature of the moiety containing the polar groups introduced into the polymeric material, typically about 0.5 mol % to about 5 mol %, preferably about 1 mol % to about 3 mol %, of the hydroxyl groups will be derivatized. Derivatization of phenolic resins with compounds that contain the diazonaphthoquinone moiety is well known and is described, for example, in West, U.S. Pat. Nos. 5,705,308, and 5,705,322.

One group of binders that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried out by reaction of the polymeric material with, for example, a sulfonyl chloride such as p-toluene sulfonyl chloride in the presence of a base such as a tertiary amine. A useful material is a novolac resin in which about 1 mol % to 3 mol %, preferably about 1.5 mol % to about 2.5 mol %, of the hydroxyl groups have been converted to phenyl sulfonate or p-toluene sulfonate (tosyl) groups.

The imageable composition may also comprise other ingredients such as dyes and surfactants that are conventional ingredients of imageable compositions. Surfactants may be present as, for example, coating aids. A dye may be present to aid in the visual inspection of the imaged and/or developed element. Printout dyes distinguish the imaged regions from the unimaged regions during processing. Contrast dyes distinguish the unimaged regions from the imaged regions in the developed imageable element. Preferably the dye does not absorb the imaging radiation. Triarylmethane dyes, such as described above, may act as contrast dyes and/or dissolution inhibitors.

Underlayer

The underlayer is between the hydrophilic surface of the substrate and the imageable layer. After imaging, it is removed along with the imageable layer by the developer in the imaged regions to reveal the underlying hydrophilic surface of the substrate. The underlayer comprises the acidic copolymer or a mixture of the acidic copolymers. Other ingredients that are conventional ingredients of the underlayer of multilayer thermally imageable elements, such as surfactants, may also be present. The underlayer typically has a dry coating weight of about 0.5 $g/m^2$ to about 2.5 $g/m^2$.

The acidic copolymers are soluble in and/or removable by alkaline developers. In addition, they are soluble in a 1,3-dioxolane/propylene glycol methyl ether/gamma-butyrolactone/water (65:15:10:10 by weight), which can be used as the coating solvent for the underlayer. However, they are poorly soluble in solvents such as acetone, which can be used as solvents to coat the imageable layer on top of the underlayer without dissolving the underlayer.

The underlayer typically comprises the photothermal conversion material. Alternatively, the photothermal material may be a separate absorber layer. When an absorber layer is present, it is between the imageable layer and the underlayer. The absorber layer preferably consists essentially of the infrared absorbing compound and, optionally, a surfactant. It may be possible to use less of the infrared absorbing compound if it is present in a separate absorber layer rather than in the underlayer. The absorber layer preferably has a thickness sufficient to absorb at least 90%, preferably at least 99%, of the imaging radiation. Typically, the absorber layer has a coating weight of about 0.02 $g/m^2$ to about 2 $g/m^2$, preferably about 0.05 $g/m^2$ to about 1.5 $g/m^2$. Elements that comprise an absorber layer are disclosed in Shimazu, U.S. Pat. No. 6,593,055.

To minimize migration of the photothermal conversion material from the underlayer to the imageable layer during manufacture and storage of the imageable element, the element may comprise a barrier layer between the underlayer and the imageable layer. The barrier layer comprises a polymeric material that is soluble in the developer. If this polymeric material is different from the polymeric material in the underlayer, it is preferably soluble in at least one organic solvent in which the polymeric material in the underlayer is insoluble. A preferred polymeric material for the barrier layer is polyvinyl alcohol. When the polymeric material in the barrier layer is different from the polymeric material in the underlayer, the barrier layer should be less than about one-fifth as thick as the underlayer, preferably less than a tenth of the thickness of the underlayer.

Photothermal Conversion Material

Imageable elements that are to be imaged with infrared radiation typically comprise an infrared absorber, known as a photothermal conversion material. Photothermal conversion materials absorb radiation and convert it to heat. Although a photothermal conversion material is not necessary for imaging with a hot body, imageable elements that contain a photothermal conversion material may also be imaged with a hot body, such as a thermal head or an array of thermal heads.

The photothermal conversion material may be any material that can absorb radiation and convert it to heat. Suitable materials include dyes and pigments. Suitable pigments include, for example, carbon black, Heliogen Green, Nigrosine Base, iron (III) oxide, manganese oxide, Prussian Blue, and Paris Blue. Because of its low cost and wide absorption bands that allow it to be used with imaging devices having a wide range of peak emission wavelengths, one particularly useful pigment is carbon black. The size of the pigment particles should not be more than the thickness of the layer that contains the pigment. Preferably, the size of the particles will be half the thickness of the layer or less.

To prevent sludging of the developer by insoluble material, photothermal conversion materials that are soluble in the developer are preferred. The photothermal conversion material may be a dye with the appropriate absorption spectrum and solubility. Dyes, especially dyes with a high extinction coefficient in the range of 750 nm to 1200 nm, are preferred. Examples of suitable dyes include dyes of the following classes: methine, polymethine, arylmethine, cyanine, hemicyanine, streptocyanine, squarylium, pyrylium, oxonol, naphthoquinone, anthraquinone, porphyrin, azo, croconium, triarylamine, thiazolium, indolium, oxazolium, indocyanine, indotricarbocyanine, oxatricarbocyanine, phthalocyanine, thiocyanine, thiatricarbocyanine, merocyanine, cryptocyanine, naphthalocyanine, polyaniline, polypyrrole, polythiophene, chalcogenopyryloarylidene and bis (chalcogenopyrylo)polymethine, oxyindolizine, pyrazoline azo, and oxazine classes. Absorbing dyes are disclosed in numerous publications, for example, Nagasaka, EP 0,823,327; DeBoer, U.S. Pat. No. 4,973,572; Jandrue, U.S. Pat. No. 5,244,771; Patel, U.S. Pat. No. 5,208,135; and Chapman, U.S. Pat. No. 5,401,618. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), SpectraIR 830A and SpectraIR 840A (Spectra Colors), as well as IR Dye A, and IR Dye B, whose structures are shown below.

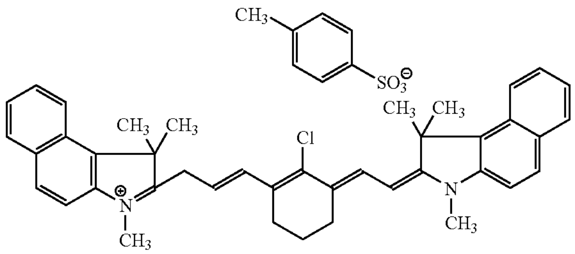

IR Dye A

-continued

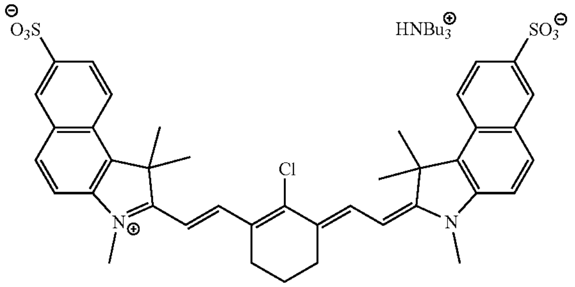

IR Dye B

The amount of photothermal conversion present in the element is generally sufficient to provide an optical density of at least 0.05, and preferably, an optical density of from about 0.5 to at least about 2 to 3 at the imaging wavelength. As is well known to those skilled in the art, the amount of compound required to produce a particular optical density at a particular wavelength can be determined using Beer's law.

To prevent ablation during imaging with infrared radiation, when the element is a multi-layer imageable element, the imageable layer is preferably substantially free of photothermal conversion material. That is, the photothermal conversion material in the imageable layer, if any, absorbs less than about 10% of the imaging radiation, preferably less than about 3% of the imaging radiation, and the amount of imaging radiation absorbed by the imageable layer, if any, is not enough to cause ablation of the imageable layer.

Substrate

The substrate comprises a support, which may be any material conventionally used to prepare imageable elements useful as lithographic printing plates. The support is preferably strong, stable, and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces improve adhesion to subsequent layers. The nature of this layer or layers depends upon the substrate and the composition of subsequent layer or layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

When the substrate comprises a sheet of aluminum or an aluminum alloy, it should be of sufficient thickness to sustain the wear from printing and thin enough to wrap around a cylinder in a printing press, typically about 100 μm to about 600 μm. It is typically cleaned, roughened, and anodized by various methods known in the art. Initially, a degreasing treatment with a surfactant, an organic solvent, or an alkaline water solution is typically administered to the remove oil and grease from the surface of the sheet. Then the surface may be roughened by well known techniques, such as mechanical roughening, for example ball polishing, brush polishing, blast polishing and buff polishing, chemical roughening in which the surface is roughened by selectively dissolving the surface, or electrochemical roughening, or a combination of such chemical, mechanical, and/or electrochemical treatments (multi-graining). Etching of the substrate is performed using hot acidic (such as sulfuric or phosphoric) solutions or alkaline solutions (such as sodium hydroxide or trisodium phosphate mixed with sodium hydroxide). Anodic oxidation may be carried out to form a hydrophilic layer of aluminum oxide of the surface, typically a layer of aluminum oxide of at least 0.3 $g/m^2$ in weight. Anodic oxidation is performed by passing a current using the support as an anode in an electrolytic solution comprising an electrolyte, such as, for example, sulfuric acid, phosphoric acid, chromic acid, boric acid, citric acid, oxalic acid, or a mixture thereof. Anodic oxidation is disclosed, for example, in Fromson, U.S. Pat. No. 3,280,734, and Chu, U.S. Pat. No. 5,152,158.

Then, the cleaned, roughened, and anodized support may be hydrophilized with an alkali metal silicate, such as aqueous potassium silicate, lithium silicate, or, typically, sodium silicate. Hydrophilization is described, for example, in Jewett, U.S. Pat. No. 2,714,066, and Fromson, U.S. Pat. No. 3,181,461. The support is either immersed in or electrolyzed in an aqueous solution of the alkali metal silicate.

Typically, the substrate comprises an interlayer between the aluminum support and the overlying layer or layers. The interlayer may be formed by treatment of the aluminum support with, for example, silicate, dextrine, hexafluorosilicic acid, phosphate/fluoride, polyvinyl phosphonic acid (PVPA), vinyl phosphonic acid co-polymers, or a water-soluble diazo resin. Co-polymers that comprise (1) phosphonic acid groups and/or phosphate groups, and (2) acid groups and/or groups that comprise alkylene glycol or polyalkylene glycol side chains, which are useful as interlayer materials, are also disclosed in U.S. patent application Ser. No. 10/922,782, filed Aug. 20, 2004, the disclosure of which are incorporated herein by reference. Co-polymers that comprise (1) acid groups and/or phosphonic acid groups, and (2) silyl groups substituted with three alkoxy and/or phenoxy groups, useful as interlayer material, are disclosed in U.S. patent application Ser. No. 10/928,339, filed Aug. 27, 2004, the disclosure of which are incorporated herein by reference.

The back side of the support (i.e., the side opposite the imageable layer) may be coated with an antistatic agent and/or a slipping layer or matte layer to improve handling and "feel" of the imageable element.

Preparation of the Imageable Element

Multi-layer imageable elements may be prepared by sequentially applying the underlayer over the hydrophilic surface of the substrate; applying the absorber layer or the barrier layer if present, over the underlayer; and then applying the imageable layer using conventional techniques. Typically the ingredients are dispersed or dissolved in a suitable coating solvent, and the resulting mixture coated by conventional methods, such as spin coating, bar coating, gravure coating, die coating, or roller coating. The underlayer may be applied, for example, from mixtures of 1,3-dioxolane, propylene glycol methyl ether, butyrolactone, and water.

When neither a barrier layer nor an absorber layer is present, the imageable layer is coated on the underlayer. To prevent the underlayer from dissolving and mixing with the imageable layer, the imageable layer should be coated from a solvent in which the underlayer layer is essentially insoluble. Thus, the coating solvent for the imageable layer should be a solvent in which the components of the imageable layer are sufficiently soluble that the imageable layer can be formed and in which any underlying layers are essentially insoluble. Typically, the solvents used to coat the underlying layers are more polar than the solvent used to coat the imageable layer. The imageable layer may be applied, for example, from diethyl ketone, or from mixtures of diethyl ketone and 1-methoxy-2-propyl acetate. An intermediate drying step, i.e., drying the underlayer, if present, to remove coating solvent before coating the imageable layer over it, may also be used to prevent mixing of the layers.

Alternatively, the underlayer, the imageable layer or both layers may be applied by conventional extrusion coating methods from a melt mixture of layer components. Typically, such a melt mixture contains no volatile organic solvents.

Imaging and Processing

The element may be thermally imaged with a laser or an array of lasers emitting modulated near infrared or infrared radiation in a wavelength region that is absorbed by the imageable element. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Suitable commercially available imaging devices include image setters such as the CREO® Trendsetter (Creo, Burnaby, British Columbia, Canada), the Screen PlateRite model 4300, model 8600, and model 8800 (Screen, Rolling Meadows, Chicago, Ill., USA), and the Gerber Crescent 42T (Gerber).

Alternatively, the imageable element may be thermally imaged using a hot body, such as a conventional apparatus containing a thermal printing head. A suitable apparatus includes at least one thermal head but would usually include a thermal head array, such as a TDK Model No. LV5416 used in thermal fax machines and sublimation printers, the GS618-400 thermal plotter (Oyo Instruments, Houston, Tex., USA), or the Model VP-3500 thermal printer (Seikosha America, Mahwah, N.J., USA).

Imaging produces an imaged element, which comprises a latent image of imaged regions and complementary unimaged regions. Development of the imaged element to form a printing plate, or printing form, converts the latent image to an image by removing the imaged regions, revealing the hydrophilic surface of the underlying substrate.

Suitable developers depend on the solubility characteristics of the ingredients present in the imageable element. The developer may be any liquid or solution that can penetrate and remove the imaged regions of the imageable element without substantially affecting the complementary unimaged regions. While not being bound by any theory or explanation, it is believed that image discrimination is based on a kinetic effect. The imaged regions of the imageable layer are removed more rapidly in the developer than the unimaged regions.

Development is carried out for a long enough time to remove the imaged regions of the imageable layer and the underlying regions of the other layer or layers of the element, but not long enough to remove the unimaged regions of the imageable layer. Hence, the imageable layer is described as being “not removable” by, or “insoluble” in, the developer prior to imaging, and the imaged regions are described as being “soluble” in, or “removable” by, the developer because they are removed, i.e. dissolved and/or dispersed, more rapidly in the developer than the unimaged regions. Typically, the underlayer is dissolved in the developer and the imageable layer is dissolved and/or dispersed in the developer.

Useful developers are aqueous solutions having a pH of about 7 or above and solvent based alkaline developers. Common components of developers are surfactants; chelating agents, such as salts of ethylenediamine tetraacetic acid; organic solvents such as benzyl alcohol and phenoxyethanol; and alkaline components such as inorganic metasilicates, organic metasilicates, hydroxides or bicarbonates. Typical aqueous alkaline developers are those that have a pH between about 8 and about 13.5, typically at least about 11, preferably at least about 12.

The developer may also comprise a surfactant or a mixture of surfactants. Preferred surfactants include: alkali metal salts of alkyl naphthalene sulfonates; alkali metal salts of the sulfate monoesters of aliphatic alcohols, typically having six to nine carbon atoms; and alkali metal sulfonates, typically having six to nine carbon atoms. A preferred alkali metal is sodium. The surfactant or mixture of surfactants typically comprises about 0.5 wt % to about 15 wt % based on the weight of the developer, preferably about 3 wt % to about 8 wt %, based on the weight of the developer. As is well known to those skilled in the art, many surfactants are supplied as aqueous surfactant solutions. These percentages are based on the amount of surfactant (i.e. the amount of active ingredient or ingredients exclusive of water and other inactive materials in the surfactant solution) in the developer.

A developer may also comprise a buffer system to keep the pH relatively constant, typically between about 5.0 and about 12.0, preferably between about 6.0 and about 11.0, more preferably between about 8.0 and about 10.0. Numerous buffer systems are known to those skilled in the art. Typically buffer systems include, for example: combinations of water-soluble amines, such as mono-ethanol amine, diethanol amine, tri-ethanol amine, or tri-1-propyl amine, with a sulfonic acid, such as benzene sulfonic acid or 4-toluene sulfonic acid; mixtures of the tetra sodium salt of ethylene diamine tetracetic acid (EDTA) and EDTA; mixtures of phosphate salts, such as mixtures of mono-alkali phosphate salts with tri-alkali phosphate salts; and mixtures of alkali borates and boric acid. Water typically comprises the balance of the developer.

Solvent-based alkaline developers, which are typically used with negative working imageable elements, are excellent developers for use with the positive working, multi-layer, thermally imageable elements of this invention. Solvent-based developers comprise an organic solvent or a mixture of organic solvents. The developer is a single phase. Consequently, the organic solvent must be miscible with water, or at least soluble in the developer to the extent it is added to the developer, so that phase separation does not occur. The following solvents and mixtures of these solvents are suitable for use in the developer: the reaction products of phenol with ethylene oxide and propylene oxide, such as ethylene glycol phenyl ether (phenoxyethanol); benzyl alcohol; esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethylethanol and 2-butoxyethanol. A single organic solvent or a mixture of organic solvents can be used. The organic solvent is typically present in the developer at a concentration of between about 0.5 wt % to about 15 wt %, based on the weight of the developer, preferably between about 3 wt % and about 5 wt %, based on the weight of the developer.

Useful commercially available solvent-based developers include ND-1 Developer, 956 Developer and 955 Developer (Kodak Polychrome Graphics, Norwalk, Conn., USA.). Developers consisting of 1 part ND-1 Developer and 3 to 7 parts of water are also useful. Other useful developers are aqueous alkaline developers, such as 3000 Developer and 9000 Developer (Kodak Polychrome Graphics, Norwalk, Conn., USA).

The developer is typically applied to the precursor by spraying the element with sufficient force to remove the exposed regions. Alternatively, development may carried out in a processor equipped with an immersion-type developing bath, a section for rinsing with water, a gumming section, a drying section, and a conductivity-measuring unit, or the imaged precursor may be brushed with the developer. In each instance, a printing plate is produced. Development may conveniently be carried out in a commercially available spray-on processor, such as an 85 NS (Kodak Polychrome Graphics) or in a commercially available immersion-type processor such as the PK910 Mark II Processor (Kodak Polychrome Graphics).

High pH developers can be used. High pH developers typically have a pH of at least about 11, more typically at least about 12, even more typically from about 12 to about 14. High pH developers also typically comprise at least one alkali metal silicate, such as lithium silicate, sodium silicate, and/or potassium silicate, and are typically substantially free of organic solvents. The alkalinity can be provided by using a hydroxide or an alkali metal silicate, or a mixture. Preferred hydroxides are ammonium, sodium, lithium and, especially, potassium hydroxides. The alkali metal silicate has a $SiO_2$ to $M_2O$ weight ratio of at least 0.3 (where M is the alkali metal), preferably this ratio is from 0.3 to 1.2, more preferably 0.6 to 1.1, most preferably 0.7 to 1.0. The amount of alkali metal silicate in the developer is at least 20 g $SiO_2$ per 100 g of composition and preferably from 20 to 80 g, most preferably it is from 40 to 65 g. High pH developers can be used in an immersion processor. Typical high pH developers include PC9000, PC3000, Goldstar™, Greenstar™, PD-1, ThermalPro™, PROTHERM®, MX 1813, and MX1710, aqueous alkaline developers (Kodak Polychrome Graphics). Another useful developer is 200 parts of Goldstar™ developer, 4 parts of polyethylene glycol 1449, 1 part of sodium metasilicate pentahydrate, and 0.5 part of TRITON® H-22 surfactant.

Following development, the resulting printing plate is rinsed with water and dried. Drying may be conveniently carried out by infrared radiators or with hot air. After drying, the printing plate may be treated with a gumming solution comprising one or more water-soluble polymers, for example polyvinylalcohol, polymethacrylic acid, polymethacrylamide, polyhydroxyethylmethacrylate, polyvinylmethylether, gelatin, and polysaccharide such as dextrine, pullulan, cellulose, gum arabic, and alginic acid. A preferred material is gum arabic.

The plate is preferably baked to increase the press runlength of the plate. Baking can be carried out, for example, at about 220° C. to about 260° C. for about 5 minutes to about 15 minutes, or at a temperature of about 110° C. to about 130° C. for about 25 to about 35 min.

INDUSTRIAL APPLICABILITY

Once a lithographic printing plate precursor has been imaged and developed to form a lithographic printing plate, printing can then be carried out by applying a fountain solution and then lithographic ink to the image on its surface. The fountain solution is taken up by the unimaged regions, i.e., the surface of the hydrophilic substrate revealed by the imaging and development process, and the ink is taken up by the imaged regions, i.e., the regions not removed by the development process. The ink is then transferred to a suitable receiving material (such as cloth, paper, metal, glass or plastic) either directly or indirectly using an offset printing blanket to provide a desired impression of the image thereon.

The advantageous properties of this invention can be observed by reference to the following examples, which illustrate but do not limit the invention.

EXAMPLES

Glossary

| | |
|---|---|
| AIBN | 2,2'-Azobisisobutyronitrile (DuPont, Wilmington, Delaware, USA) |
| BC | 2-Butoxyethanol (Butyl CELLOSOLVE ®) (80 vol % in water) |
| BLO | gamma-Butyrolactone |
| BYK-307 | Polyethoxylated dimethylpolysiloxane co-polymer (BYK Chemie, Wallingford, CT, USA) |
| Copolymer 1 | N-phenylmaleimide (5 wt %); methacrylamide (10 wt %); acrylonitrile (45 wt %); Monomer 1 (40 wt %) |
| Copolymer 2 | N-phenylmaleimide (20 mol %), methacrylamide (35 mol %), methacrylic acid (20 mol %); Monomer 1 (25 mol %) |
| Copolymer 3 | N-phenylmaleimide (20 mol %), methacrylamide (35 mol %), methacrylic acid (20 mol %), Monomer 2 (25 mol %) |
| Copolymer 4 | N-phenylmaleimide (35 mol %), methacrylamide (20 mol %), methacrylic acid (20 mol %), Monomer 1 (25 mol %) |
| Copolymer 5 | N-phenylmaleimide (35 mol %), methacrylamide (20 mol %), methacrylic acid (20 mol %), Monomer 2 (25 mol %) |
| D11 | Ethanaminium, N-[4-[[4-(diethylamino)phenyl][4-(ethylamino)-1-naphthalenyl]methylene]-2,5-cyclohexadien-1-ylidene]-N-ethyl-, salt with 5-benzoyl-4-hydroxy-2-methoxybenzenesulfonic acid (1:1); colorant dye (see structure below) (PCAS, Longjumeau, France); CAS # 433334-19-1 |
| DAA | Diacetone alcohol (80 vol % in water) |
| Ethyl violet | C.I. 42600; CAS 2390-59-2 ($lambda_{max}$ = 596 nm) $[(p-(CH_3CH_2)_2NC_6H_4)_3C^+ Cl^-]$ (Aldrich, Milwaukee, WI, USA); CAS # 2390-59-2 |
| Goldstar ™ Developer | Sodium metasilicate based aqueous alkaline developer (Kodak Polychrome Graphics, Norwalk, CT, USA) |
| IR Dye A | Infrared absorbing dye ($lambda_{max}$ = 830 nm) (Eastman Kodak, Rochester, NY, USA) (see structure above); CAS # 134127-48-3 |
| Monomer 1 | Reaction product of m-TMI and p-aminobenzoic acid, see Example 1 |
| Monomer 2 | Reaction product of MOI and p-aminobenzoic acid, see Example 2 |
| MOI | 2-(Methacryloxy)ethyl isocyanate |
| ND-1 | Solvent-based negative developer (Kodak Polychrome Graphics, Norwalk, CT, USA) |
| PGME | Propylene glycol methyl ether (1-methoxy-2-propanol) |
| PD-1 Developer | Aqueous alkaline developer concentrate (Kodak Polychrome Graphics, Norwalk, CT, USA) |
| Polymer A | 91:9 methyl methacrylate/methacrylic acid copolymer |
| Substrate A | 0.3 mm gauge, aluminum sheet which had been electrograined, anodized and treated with an aqueous solution of sodium dihydrogen phosphate/sodium fluoride. |
| T183 Developer | 200 parts of Goldstar ™ Developer, 4 parts of polyethylene glycol 1449, 1 part of sodium metasilicate pentahydrate, and 0.5 part of TRITON ® H-22 surfactant |
| m-TMI | 3-Iso-propenyl-alpha, alpha-dimethylbenzyl isocyanate |
| TRITON ® H-22 | Phosphate ester surfactant |

D11

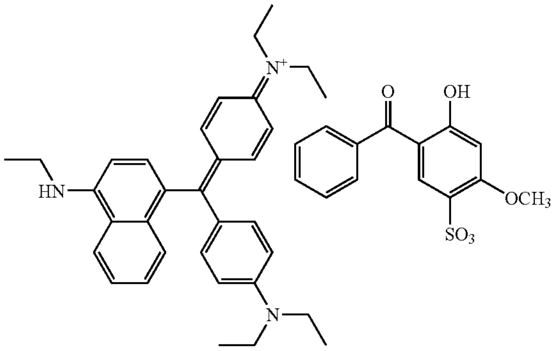

Example 1

Synthesis of Monomer 1: A mixture of 125 g of dimethylacetamide and 48.029 g of p-aminobenzoic acid was added to a 500 ml round bottom flask. The mixture was heated at 75° C. with stirring for 0.5 h to dissolve the p-aminobenzoic acid. The reaction mixture was cooled to room temperature, and 66.084 g of m-TMI added over 1 h with cooling to maintain the temperature of the reaction mixture below 40° C. Then the reaction mixture was heated to 55° C. for about 0.5 h. The reaction mixture was stirred at 45° C. for an additional 24 h, and the absence of isocyanate confirmed by disappearance of the NCO absorption at 2275 $cm^{-1}$. Concentrated hydrochloric acid (2.5 ml) was added, and the reaction mixture stirred for 0.25 h and then poured into 1.5 L of water. The precipitate was filtered off, washed with 0.5 L of water, and dried in vacuum below 40° C. Yield 107.73 g (92%) of yellow monomer.

Example 2

Synthesis of Monomer 2: The procedure of Example 1 was repeated except that 55.607 g of 4-aminobenzoic acid and 58.980 g of MOI were used. Yield 113.75 g (99%) of white monomer.

Example 3

Preparation of Copolymer 1: A 11 four neck round bottom flask was fitted with a heating mantle, stirrer, thermometer, condenser, and nitrogen atmosphere. A mixture of Monomer 1 (16.0 g), methacrylamide (4.00 g), N-phenylmaleimide (2.00 g), acrylonitrile (18.00 g), and dioxolane/ethanol (50:50 v:v)(136 g) was added to the vessel, and the reaction mixture heated to 60° C. under a nitrogen atmosphere for 1 h. The reaction mixture was maintained at 60° C., and AIBN (0.054 g) in dioxolane (0.50 g) added hourly for 24 hr. The reaction mixture was cooled to room temperature, and the resulting copolymer was isolated by pouring the reaction mixture into 1 L of ethanol/water (80/20) to which five drops of concentrated hydrochloric acid had been added. The copolymer was filtered off, washed with 1 L of ethanol/water (80/20), filtered again, and dried for 2 days at 50° C. Yield: 16.52 g (41%).

Example 4

Preparation of Copolymer 2: The procedure of Example 3 was repeated except that a mixture of Monomer 1 (20.36 g), methacrylic acid (4.14 g), methacrylamide (7.17 g), and N-phenylmaleimide (8.33 g) was used to form the copolymer. Yield: 26.50 g (66%).

Example 5

Preparation of Copolymer 3: The procedure of Example 3 was repeated except that a mixture of Monomer 2 (18.89 g), methacrylic acid (4.45 g), methacrylamide (7.70 g), and N-phenylmaleimide (8.95 g) was used, and the reaction mixture was heated and stirred with the addition of AIBN for 12 hr. Yield: 21.19 g (53% yield).

Example 6

Preparation of Copolymer 4: The procedure of Example 3 was repeated except that a mixture of Monomer 1 (18.89 g), methacrylic acid (3.84 g), methacrylamide (3.79 g), and N-phenylmaleimide (13.51 g) was used. Yield: 18.45 g (46% yield).

Example 7

Preparation of Copolymer 5: The procedure of Example 3 was repeated except that a mixture of Monomer 2 (17.41 g), methacrylic acid (4.10 g), methacrylamide (4.05 g), and N-phenylmaleimide (14.44 g) was used. Yield: 38.28 g (96% yield).

Examples 8-11

Elements comprising an underlayer on a substrate were prepared by the following procedure. Coating solutions containing 7.5 wt % of a mixture containing 84.5 wt % of each of the copolymers indicated in Table 1, 15.0 wt % of IR Dye A, and 0.5 wt % of BYK 307, in a mixture of 1,3-dioxolane/PGME/BLO/water (65:15:10:10 by weight) were coated onto Substrate A using a 0.03 in wire wound bar, and the resulting element dried at 135° C. for 35 sec. Coating weight of the resulting layer: 1.5 $g/m^2$.

The following evaluation procedures were carried out.

Developer Drop Test I Drops of water/PD-1 Developer (6:1) were placed on the surface of the imageable layer at 2 sec intervals up to 30 sec and then immediately washed off with water. The time of the first visible signs of developer attack and the time to completely dissolve the imageable layer were recorded.

Developer Drop Test II Drops of T183 Developer were placed on the surface of the imageable layer at 2 sec intervals up to 30 sec and then immediately washed off with water. The time of the first visible signs of developer attack and the time to completely dissolve the imageable layer were recorded.

Resistance to Alcohol-sub Fount Drops of DAA (diacetone alcohol, 80 vol % in water) were placed on the surface of the imageable layer at 1 min intervals up to 5 min. and then washed off with water. The amount of the imageable layer removed after 1 min was assessed.

Resistance to UV Wash Drops of BC (2-butoxyethanol, 80 vol % in water) were placed on the surface of the imageable layer at 1 min intervals up to 5 min. and then washed off with water. The amount of the imageable layer removed after 1 min was assessed.

Baking Test A strip of the imageable element was placed in a Mathis Labdryer oven with a fan speed of 1000 rpm for 8 min at 230° C. Positive image remover PE3S (Kodak Polychrome Graphics, Japan Ltd) was applied to the imageable element at 2 min intervals up to 12 min. The imageable layer was immediately rinsed with water, and the time taken for the deletion gel to start attacking the imageable layer was recorded.

The results are shown in Table 1.

TABLE 1

| Copolymer | Drop Test I (sec) | Drop Test II (sec) | DAA (% removed) | BC (% removed) | Baking test |
|---|---|---|---|---|---|
| 2 | 5 | 2 | 20 | 50 | No attack up to 10 min |
| 3 | 2 | 2 | 20 | 50 | No attack at 12 min |
| 4 | | 2 | 30 | 30 | No attack up to 8 min |
| 5 | | 2 | 30 | 50 | No attack at 12 min |

Examples 12-15

Elements containing an underlayer on a substrate were prepared by the following procedure.

Underlayer: A coating solution containing 7.5 wt % of a mixture containing 84 wt % of each of the copolymers indicated in Table 2, 15 wt % of IR Dye A, 0.5 wt % of BYK 307, and 0.5 wt % of D11 in a mixture of 1,3-dioxolane/PGME/BLO/water (65:15:10:10 by weight) was coated onto Substrate A using a 0.03 in wire wound bar, and the resulting element dried at 135° C. for 30 sec. Coating weight of the underlayer: 1.5 g/m$^2$.

The following evaluation procedures were carried out.

Developer Drop Test Drops of water/ND-1 Developer (4:1) were placed on the surface of the underlayer at 2 sec intervals up to 30 sec at 22° C., then washed off with water. The time of the first visible signs of developer attack and the time to completely dissolve the imageable layer were recorded.

Resistance to Alcohol-sub Fount Drops of DAA (diacetone alcohol, 80 vol % in water) were placed on the surface of the underlayer at 1 min intervals at 22° C. up to 5 min. and then washed off with water. The amount of the underlayer removed after 1 min was estimated.

Resistance to UV Wash Drops of BC (2-butoxyethanol, 80 vol % in water) were placed on the surface of the imageable layer at 1 min intervals at 22° C. up to 5 min. and then washed off with water. The amount of the underlayer removed after 1 min was estimated.

The results are shown in Table 2.

TABLE 2

| Copolymer | Developer drop tests (sec) | Weight loss after 1 minute (%) DAA/water | BC/water |
|---|---|---|---|
| 1 | 18 | 20 | 10 |
| 2 | 6 | 20 | 50 |
| 4 | 6 | 30 | 30 |
| 5 | 4 | 30 | 50 |

Baking Test was carried out as in Examples 8-11. The results are shown in Table 3.

TABLE 3

| Copolymer | Baking Test |
|---|---|
| 1 | No attack at 12 minutes |
| 2 | No attack up to 10 minutes |
| 4 | No attack at 8 minutes |
| 5 | No attack at 12 minutes |

Examples 16-19

Multilayer imageable elements were prepared by the following procedure.

Imageable layer: A coating solution containing 6.5 wt % of a mixture containing 99.1 wt % of Polymer A, 0.4 wt % of ethyl violet, and 0.5 wt % of BYK 307 in diethylketone/1-methoxy-2-propanol acetate (92:8, w:w) was coated onto the underlayer formed in Examples 12-15 using a 0.006 in wire wound bar, and the resulting imageable element dried at 135° C. for 30 sec. Coating weight of the imageable layer: 0.65 g/m$^2$.

The following evaluation procedure was carried out.

Imaging and Processing Tests The imageable element was thermally imaged at 830 nm on a CREO® Trendsetter 3244 at 8 watts using plot 0 and plot 12 internal test patterns. The CREO® Trendsetter 3244x is a commercially available platesetter, using Procom Plus software and having a laser diode array emitting at 830 nm (Creo Products, Burnaby, BC, Canada). The imaging energies were 136, 126, 119, 112, 105, 100, 95, 90, 86, and 83 mJ/cm$^2$. The resulting imaged imageable element developed at 30° C. in a PK91011 processor (Kodak Polychrome Graphics, Norwalk, Conn., USA) using water/ND-1 Developer (4:1) with an immersion time of 12 sec. The resulting lithographic printing plates were evaluated for cleanout (lowest imaging energy at which the imaged regions are completely removed by the developer), and best resolution (imaging energy at which printing plate performs best).

The results are shown in Table 4.

TABLE 4

| Copolymer | Minimum exposure (mJ/cm$^2$) required for: Clean out | Best Resolution |
|---|---|---|
| 1 | 136 | 136 |
| 2 | <83 | 83 |
| 4 | <83 | 105 |
| 5 | <83 | 83 |

Example 20

This example illustrates the synthesis of Polymer A, a 91:9 methyl methacrylate/methacrylic acid copolymer. 233.95 g of dioxolane/ethanol, 90.75 g of methyl methacrylate, 8.00 g of methacrylic acid, and 0.25 g of 1-decanethiol were added to a 500 ml 4-neck ground glass flask, equipped with a heating mantle, temperature controller, mechanical stirrer, condenser, pressure equalized addition funnel, and nitrogen inlet. The reaction mixture was heated to 60° C. under a nitrogen atmosphere. AIBN (1.0 g) in 20 g of dioxolane was added, and the reaction mixture heated to 60°

C. under a nitrogen atmosphere for 24 h. The co-polymer was precipitated in 1 L of water to which five drops of concentrated hydrochloric acid had been added. The copolymer was filtered off, washed with 1 L of water, and filtered again. Yield: 98 g of copolymer (98%).

Having described the invention, we now claim the following and their equivalents.

What is claimed is:

1. An imageable element comprising:

a substrate, an underlayer over the substrate, and a imageable layer over the underlayer;

in which:

the element comprises a photothermal conversion material;

the imageable layer is substantially free of the photothermal conversion material;

the imageable layer is ink receptive;

before thermal imaging, the imageable layer is not removable by an alkaline developer;

after thermal imaging to form imaged regions in the imageable layer, the imaged regions are removable by the alkaline developer;

the underlayer is removable by the alkaline developer; and the underlayer comprises an acidic copolymer that comprises, in polymerized form, about 10 mol % to about 75 mol % of an acidic monomer or mixture of acidic monomers of the formula:

$CH_2{=}CH(R^1)\text{-}Z\text{-}X{-}NH{-}CO{-}NH{-}C_6H_3{-}(R^2)(CO_2H)$;

in which:

$R^1$ is H or $CH_3$;

$R^2$ is H or OH;

Z is $-C_6H_4-$ or $-C(O)-Y-$wherein Y is $-NH-$; and

X is selected from $-C(CH_3)_2-$, $-CH(CH_3)-$ and $-(CH_2)_n-$, in which n is an integer from 1 to 12.

2. The imageable element of claim 1 in which the photothermal conversion material is in the underlayer.

3. The imageable element of claim 1 in which Z is m-$C_6H_4-$ and X is $-C(CH_3)_2-$ or $-(CH_2)_n-$ in which n is 2.

4. The imageable element of claim 3 in which $R^2$ is hydrogen.

5. The imageable element of claim 2 in which the acidic copolymer comprises, in polymerized form, about 1 mol % to about 55 mol % of N-phenylmaleimide, N-cyclohexylmaleimide, N-benzylmaleimide, or a mixture thereof.

6. The imageable element of claim 5 in which the acidic copolymer comprises, in polymerized form, about 1 mol % to about 40 mol % of acrylamide, methacrylamide, N-methoxymethylacrylamide, N-methoxymethylmethacrylamide, methoxymethyl methacrylate, or a mixture thereof.

7. The imageable element of claim 6 in which the acidic copolymer comprises, in polymerized form, about 20 mol % to about 80 mol % of acrylonitrile, methacrylonitrile, or a mixture thereof.

8. The imageable element of claim 7 in which Z is m-$C_6H_4-$ X is $-C(CH_3)_2-$ or $-(CH_2)_n-$ in which n is 2; and $R^2$ is hydrogen.

9. The imageable element of claim 8 in which the acidic copolymer comprises, in polymerized form, about 5 mol % to about 40 mol % of N-phenylmaleimide; about 5 mol % to about 30 mol % of methacrylamide; and about 35 mol % to about 65 mol % of acrylonitrile.

10. The imageable element of claim 6 in which the acidic copolymer comprises, in polymerized form, about 5 wt % to about 40 wt % of acrylic acid, methacrylic acid, vinyl benzoic acid, or a mixture thereof.

11. The imageable element of claim 10 in which Z is m-$C_6H_4-$ X is $-C(CH_3)_2-$ or $-(CH_2)_n-$ in which n is 2; and $R^2$ is hydrogen.

12. The imageable element of claim 11 in which the acidic copolymer comprises, in polymerized form, about 5 mol % to about 40 mol % of N-phenylmaleimide; about 5 mol % to about 30 mol % of methacrylamide; and about 10 mol % to 35 mol % of methacrylic acid.

13. The imageable element of claim 2 in which the imageable layer comprises a methyl methacrylate/methacrylic acid copolymer in the molar ratio of methyl methacrylate to methacrylic acid is about 80:20 to about 98:2.

14. The imageable element of claim 13 in which Z is m-$C_6H_4-$; X is $-C(CH_3)_2-$ or $-(CH_2)_n-$ in which n is 2; $R^2$ is hydrogen; and the acidic copolymer comprises, in polymerized form, about 1 wt % to about 50 wt % of N-phenylmaleimide, N-cyclohexylmaleimide, N-benzylmaleimide, or a mixture thereof.

15. The imageable element of claim 2 in which the imageable layer comprises a dissolution inhibitor and a novolac resin.

16. The imageable element of claim 15 in which Z is m-$C_6H_4-$; and X is $-C(CH_3)_2-$ or $-(CH_2)_n-$ in which n is 2; $R^2$ is hydrogen; and the acidic copolymer comprises, in polymerized form, about 1 wt % to about 50 wt % of N-phenylmaleimide, N-cyclohexylmaleimide, N-benzylmaleimide, or a mixture thereof.

17. A method for forming an image, the method comprising the steps of:

(i) thermally imaging an imageable element comprising a substrate, an underlayer over the substrate, and an imageable layer over the underlayer; and forming an imaged imageable element comprising imaged regions and complementary unimaged regions in the imageable layer;

(ii) forming the image by developing the imaged imageable element with an alkaline developer and removing the imaged regions;

in which:

the element comprises a photothermal conversion material;

the imageable layer is substantially free of the photothermal conversion material;

the imageable layer is ink receptive;

before thermal imaging, the imageable layer is not removable by an alkaline developer;

after thermal imaging to form imaged regions in the imageable layer, the imaged regions are removable by the alkaline developer;

the underlayer is removable by the alkaline developer, and the underlayer comprises an acidic copolymer that comprises, in polymerized form, about 10 mol % to about 75 mol % of an acidic monomer or mixture of acidic monomers of the formula:

$CH_2{=}CH(R^1)\text{-}Z\text{-}X{-}NH{-}CO{-}NH{-}C_6H_3{-}(R^2)(CO_2H)$;

in which:

$R^1$ is H or $CH_3$;

$R^2$ is H or OH;

Z is $-C_6H_4-$ or $-C(O)-Y-$ wherein Y is -NH-; and

X is selected from $-C(CH_3)_2-$, $-CH(CH_3)-$ and $-(CH_2)_n-$, in which n is an integer from 1 to 12.

18. The method of claim 17 in which the photothermal conversion material is in the underlayer; Z is m-$C_6H_4$—; and X is —$(CH_3)$— or —$(CH_2)_n$— in which n is 2; $R^2$ is hydrogen.

19. The method of claim 17 additionally comprising, after step (ii):

(iii) baking the image.

20. The method of claim 19 in which the acidic copolymer additionally comprises one or more monomers selected from the group consisting of acrylonitrile; methacrylonitrile, acrylic acid, methacrylic acid, methyl acrylate, ethyl acrylate, butyl acrylate, methyl methacrylate, methoxymethyl methacrylate, ethyl methacrylate, butyl methacrylate, styrene, 3-vinyl benzoic acid, 4-vinyl benzoic acid, N-phenylmaleimide, N-cyclohexylmaleimide, N-benzylmaleimide, acrylamide, methacrylamide, N-methoxymethylacrylamide, and N-methoxymethylmethacrylamide.

21. The method of claim 19 in which the photothermal conversion material is in the underlayer; Z is m-$C_6H_4$—; and X is —$C(CH_3)_2$— or —$(CH_2)_n$— in which n is 2; $R^2$ is hydrogen.

22. The method of claim 21 in which the acidic copolymer comprises, in polymerized form, about 5 mol % to about 40 mol % of N-phenylmaleimide; about 5 mol % to about 30 mol % of methacrylamide; and about 35 mol % to about 65 mol % of acrylonitrile.

23. The method of claim 21 in which the acidic copolymer comprises, in polymerized form, about 5 mol % to about 40 mol % of N-phenylmaleimide; about 5 mol % to about 30 mol % of methacrylamide; and about 10 mol % to about 35 mol % of methacrylic acid.

24. The method of claim 19 in which the imageable layer comprises a methyl methacrylate/methacrylic acid copolymer in the molar ratio of methyl methacrylate to methacrylic acid is about 80:20 to about 98:2.

25. The method of claim 24 in which Z is m-$C_6H_4$—; and X is —$C(CH_3)_2$— or —$(CH_2)_n$— in which n is 2; $R^2$ is hydrogen; and the acidic copolymer comprises, in polymerized form, about 1 mol % to about 55 mol % of N-phenylmaleimide, N-cyclohexylmaleimide, N-benzylmaleimide, or a mixture thereof.

26. The method of claim 19 in which the imageable layer comprises a dissolution inhibitor and a novolac resin.

27. The method of claim 26 in which Z is m-$C_6H_4$—; and X is —$C(CH_3)_2$— or —$(CH_2)_n$— in which n is 2; $R^2$ is hydrogen; and the acidic copolymer comprises, in polymerized form, about 1 mol % to about 55 mol % of N-phenylmaleimide, N-cyclohexylmaleimide, N-benzylmaleimide, or a mixture thereof.

* * * * *

UNITED STATES PATENT AND TRADEMARK OFFICE
CERTIFICATE OF CORRECTION

PATENT NO. : 7,291,440 B2 
APPLICATION NO. : 11/129844
DATED : November 6, 2007
INVENTOR(S) : Kevin B. Ray et al.

It is certified that error appears in the above-identified patent and that said Letters Patent is hereby corrected as shown below:

| | |
|---|---|
| Col. 21, Claim 1, line 36 (approx) | In Claim 1, delete "Y–wherein" and insert -- Y– wherein --, therefor. |
| Col. 23, Claim 18, line 3 | In Claim 18, delete "–(CH3)–" and insert -- –C(CH3)2– --, therefor. |
| Col. 23, Claim 21, line 18 | In Claim 21, delete "phototherrnal" and insert -- photothermal --, therefor. |

Signed and Sealed this

Fifteenth Day of April, 2008

JON W. DUDAS
*Director of the United States Patent and Trademark Office*